(12) United States Patent
Challener

(10) Patent No.: US 7,272,102 B2
(45) Date of Patent: Sep. 18, 2007

(54) RIDGE WAVEGUIDE WITH RECESS

(75) Inventor: William Albert Challener, Sewickley, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 407 days.

(21) Appl. No.: 10/402,880

(22) Filed: Mar. 28, 2003

(65) Prior Publication Data

US 2003/0184903 A1 Oct. 2, 2003

Related U.S. Application Data

(60) Provisional application No. 60/368,909, filed on Mar. 29, 2002.

(51) Int. Cl.
*G11B 7/00* (2006.01)
(52) U.S. Cl. .................................... 369/112.27; 385/38
(58) Field of Classification Search ............ 369/13.33, 369/13.13, 14, 112.17, 112.24, 112.27, 112.01, 369/112.05, 112.09, 112.14, 112.21; 385/129, 385/132, 15, 31, 38; 333/26, 33
See application file for complete search history.

(56) References Cited

U.S. PATENT DOCUMENTS

| 5,199,090 | A | | 3/1993 | Bell ............................ 385/33 |
| 5,245,491 | A | | 9/1993 | Horie et al. .................. 360/114 |
| 5,288,998 | A | | 2/1994 | Betzig et al. ............ 250/227.26 |
| 5,563,902 | A | * | 10/1996 | Xu et al. ...................... 372/50 |
| 5,625,617 | A | * | 4/1997 | Hopkins et al. ............ 369/121 |
| 5,689,480 | A | | 11/1997 | Kino ........................... 369/14 |
| 5,696,372 | A | | 12/1997 | Grober et al. .............. 250/216 |
| 5,796,706 | A | | 8/1998 | Shintani et al. ............ 369/126 |
| 5,859,814 | A | | 1/1999 | Kino et al. ................... 369/13 |
| 5,883,872 | A | | 3/1999 | Kino .......................... 369/112 |
| 5,910,940 | A | | 6/1999 | Guerra .................... 369/275.1 |

(Continued)

FOREIGN PATENT DOCUMENTS

JP 57-087202 * 5/1982 ............ 369/112.27

(Continued)

OTHER PUBLICATIONS

Aers, et al., "Non-radiative surface plasmon-polariton modes of inhomogenous metal circular cylinders," J. Phys. F: Metal Phys, 10, (1980), 53-65.

(Continued)

*Primary Examiner*—Tan Dinh
(74) *Attorney, Agent, or Firm*—Benjamin T. Queen, II; Pietragallo Bosick & Gordon, LLP

(57) ABSTRACT

A ridge waveguide having a recessed ridge forming an isolated tip at a terminal end of the waveguide's aperture efficiently couples light into a spot adjacent to the tip in a medium below the terminal end of the waveguide which is significantly smaller than the light's wavelength. The waveguide is used to heat a recording medium via the small spot for heat assisted recording or to pattern substrates by photolithography with line width exposures that are significantly smaller than the wavelength of light. The body of the waveguide may also be recessed away from the medium in an area surrounding the waveguide's aperture to further confine the energy emerging from the waveguide to the small spot adjacent the tip in the medium.

22 Claims, 8 Drawing Sheets

U.S. PATENT DOCUMENTS

| | | | | |
|---|---|---|---|---|
| 5,936,928 | A | 8/1999 | Jain et al. | 369/99 |
| 5,982,716 | A | 11/1999 | Kino et al. | 369/14 |
| 5,986,978 | A | 11/1999 | Rottmayer et al. | 369/13 |
| 6,061,322 | A | 5/2000 | Jain et al. | 369/99 |
| 6,104,687 | A | 8/2000 | Lee et al. | 369/112 |
| 6,108,135 | A | 8/2000 | Ho | 359/654 |
| 6,172,944 | B1 | 1/2001 | Hatam-Tabrizi | 369/13 |
| 6,181,478 | B1 | 1/2001 | Mandella | 359/642 |
| 6,208,789 | B1 | 3/2001 | Ogimoto | 385/123 |
| 6,215,114 | B1 | 4/2001 | Yagi et al. | 250/216 |
| 6,236,634 | B1 | 5/2001 | Lee et al. | 369/112.23 |
| 6,243,350 | B1 | 6/2001 | Knight et al. | 369/126 |
| 6,275,453 | B1 * | 8/2001 | Ueyanagi et al. | 369/44.14 |
| 6,445,667 | B1 * | 9/2002 | Bernacki et al. | 369/100 |
| 6,631,231 | B2 * | 10/2003 | Mizuuchi et al. | 385/122 |
| 2002/0097109 | A1 * | 7/2002 | du Toit et al. | 333/26 |
| 2003/0112542 | A1 * | 6/2003 | Rettner et al. | 360/59 |
| 2004/0062152 | A1 * | 4/2004 | Stancil et al. | 369/13.05 |

FOREIGN PATENT DOCUMENTS

| | | | | |
|---|---|---|---|---|
| JP | 4-065902 A | * | 3/1992 | 333/246 |
| WO | WO-99/35643 | | 7/1999 | |
| WO | WO-99/38160 | | 7/1999 | |

OTHER PUBLICATIONS

Alvarez, et al., "Electromagnetic transmission of nanometric circular aperture on top of a metal coated optical fiber tip: Theory", J. Vac. Sci. Technol. B, 18(1), Jan./Feb. 2000, 82-89.

Ashley, et al., "Dispersion Relations for Non-Radiative Surface Plasmons on Cylinders," Surface Science 41, (1974), 615-618.

Cohn, S., "Properties of Ridge Wave Guide," Proceedings of the I.R.E., Aug. 1947, 783-788.

Getsinger, W., "Ridge Waveguide Field Description and Application to Directional Couplers," IRE Transactions on Microwave Theory and Techniques, Jan. 1962, 41-50.

Hoefer, et al., "Closed-Form Expressions for the Parameters of Finned and Ridged Waveguides," IEEE Transactions on Microwave Theory and Techniques, vol. MTT-30, 12, Dec. 1982.

Hopfer, S., "The Design of Ridged Waveguides," IRE Transactions—Microwave Theory and Techniques, MTT-3, Oct. 1955, 20-29.

Jarvis, et al., "Design of double-ridged rectangular waveguide of arbitrary aspect ratio and ridge height," IEE Proc. Microw. Antennas Propag, 147 (1), Feb. 2000, 31-34.

Khosravi, et al., "Surface polaritons in cylindrical optical fibers," J. Opt. Soc. Am A/vol. 8, No. 1, Jan. 1991, 112-122.

Montgomery, J., "On the Complete Eigenvalue Solution of Ridged Waveguide," IEEE Transactions on Microwave Theory and Techniques, MTT-19, 6, Jun. 1971, 547-555.

Novotny, et al., "Light propagation in a cylindrical waveguide with a complex, metallic, dielectric function," Physical Review E, 50(50), Nov. 1994, 4094-4106.

Pfeiffer, et al., "Surface polaritons in a circularly cylindrical interface: Surface plasmons," Physical Review B, 10(8), Oct. 15, 1974, 3038-3051.

Prade, et al., "Guided Optical Waves in Fibers With Negative Dielectric Constant," J. Lightwave Technology, 12(1), Jan. 1994, 6-18.

Roberts, A., "Electromagnetic theory of diffraction by a circular aperture in a thick, perfectly conducting screen," J. Opt. Soc. Am. A, 4(10), Oct. 1987, 1970-1983.

Roberts, A., "Small-hole coupling of radiation into a near-field probe," J. Appl. Phys, 70(8), Oct. 15, 1991, 4045-4049.

Shi, et al., "A Nano-aperture with 1000x Power Throughput Enhancement for Very Small Aperture Laser System (VSAL)," Proceedings of SPIE, 4342, 2002, 320-327.

Snyder, A., "Asymptotic Expressions for Eigenfunctions and Eigenvalues of a Dielectric or Optical Waveguide," IEEE Transactions on Microwave Theory and Techniques, MIT-1712, Dec. 1969, 1130-1138.

Sun, et al., "MFIE Analysis and Design of Ridged Waveguides," IEEE Transactions on Microwave Theory and Techniques, 41(11), Nov. 1993, 1965-1971.

Takahara, et al., "Guiding of a one-dimensional optical beam with nanometer diameter," Optics Letter, 22(7), Apr. 1, 1977, 475-477.

Tang, et al., "High-performance readout and recording by a combination aperture," Optics Letters, 26(24), Dec. 15, 2001, 1987-1989.

Utsumi, Y., "Variational Analysis of Ridged Waveguide Modes," IEEE Transactions on Microwave Theory and Techniques, MTT-33, 2, Feb. 1985, 111-120.

Shi, et al., "Nano-Aperture with Ultra-High Power Throughput for VSAL," Paper WCT, Proceedings of the Optical Data Storage Meeting, Santa Fe, NM (2001).

* cited by examiner

Prior Art

RIDGE WAVEGUIDE WITH RECESS

CROSS-REFERENCE TO RELATED APPLICATIONS

This application claims benefit of U.S. provisional patent application Ser. No. 60/368,909, filed on Mar. 29, 2002, which is hereby incorporated by reference.

GOVERNMENT RIGHTS

This invention was made with United States Government support under Agreement No. 70NANB1H3056 awarded by the National Institute of Standards and Technology (NIST).

The United States Government has certain rights in the invention.

BACKGROUND OF THE INVENTION

1. Field of the Invention

The invention relates to waveguides in general and more particularly to heat assisted recording. It also relates to near field microscopy and to nanoscale photolithography.

2. Description of the Related Art

Heat-assisted magnetic recording (HAMR) involves heating a spot on the surface of a magnetic recording medium to reduce its coercivity sufficiently so that it can be magnetically recorded by an applied recording field. The advantage of this technique is that the coercivity of the media at ambient can be significantly increased, thereby improving thermal stability of the recorded data even for very small bit cells. One of the difficulties with the technique is finding a method to heat just the small area which is to be recorded. Heating with laser light as is done in magneto-optic recording is the most promising approach, but the difficulty with this is that at the current storage densities contemplated for HAMR, the spot to be heated is ~25 nm in diameter, which is fifty times smaller than the wavelength of useful semiconductor lasers. The so-called diffraction limit in optics is the smallest dimension to which a light beam can be focused. The diffraction limit in three dimensions is given by the equation $$d = \frac{0.6\lambda}{n \sin\theta} \quad (1)$$

where d is the spot diameter, λ is the wavelength of the light in free space, n is the refractive index of the medium in which the light is focused, and θ is the maximum angle of focused light rays from the central axis of the lens. The factor λ/n is the wavelength of the light within the medium in which the light is focused. The spot diameter is directly proportional to the wavelength of the light within this medium. The minimum focused spot diameter in the classical diffraction limit in air is ~λ/2, which is much too large to be useful for HAMR.

When light is incident upon a small circular aperture, it is well-known in classical optics that the amount of power transmitted through the aperture scales as the ratio of the aperture to the wavelength raised to the fourth power. For an aperture with a ~25 nm diameter at a visible light wavelength of 500 nm, a typical transmission efficiency is about $10^{-6}$. This throughput is orders of magnitude too small to be practical for HAMR.

In order to circumvent this problem, a "C"-shaped aperture in an opaque metal film presents a possible approach to increasing the amount of power transmitted while keeping the spot size at the dimensions required. This design 10 is illustrated in FIG. 1. It comprises a "C"-shaped aperture 30 located within a conductive body 28. Because this structure requires some thickness to be opaque to incident light, the structure is as also sometimes referred to as a ridge waveguide. A "C"-shaped ridge waveguide has a propagating mode for light polarized perpendicular to the long dimension 22 of the waveguide cross section at a wavelength that is approximately equal to the sum of the length L of the long dimension 22 and twice the height H of the short dimension 16. However, the field density is concentrated in the region between the ridge 12 and the wall 29 opposite.

A calculation of the electric field at the bottom surface of the waveguide using finite-difference time domain ("FDTD") analysis indicates that there is a large field amplitude in the small region near the tip 26 of the ridge 12 in the waveguide 10. As a result, this structure appears suited as a means to efficiently transport optical energy into a small, sub-wavelength spot at the output end of the waveguide, at least for optical recording.

However, for the C-shaped aperture to be effective for HAMR applications, the energy must be also be efficiently absorbed by the media below the waveguide in a tightly confined spot. FIG. 2 is a contour FDTD plot of the efficiency of power absorption in the media when a typical media surface is spaced just below the waveguide. The FDTD calculation results shown in FIG. 2 are for a wavelength of 900 nm with respect to a gold structure illustrated in FIG. 1 of the following dimensions: The height H 16 of the aperture 30 is 60 nm, the length L 22 of the aperture 30 is 240 nm, the height h 20 of the ridge 12 is 36 nm, and the width w 18 of the ridge 12 is 24 nm. The index of refraction for gold is 0.17+i(5.95). Below the ridge waveguide is an air gap of 10 nm, and then the recording medium which consists of a 10 nm layer of cobalt followed by an 80 nm layer of iron. The index of refraction for the cobalt is 2.65+i(5.16). The index of refraction for iron is 3.12+i(3.87). A plane wave is incident normally from the top of the structure.

In FIG. 2, a contour plot is shown of the optical power that is dissipated within the recording medium below the ridge waveguide. The bright region 32 represents a "hot" spot where the highest density of power dissipation occurs. The dark regions 34 represent colder spots. The black lines 31 and 33 are the contours at the full width half maximum (FWHM) level. The dashed line corresponds to waveguide aperture 30.

FIG. 2 indicates that the optical power is very poorly confined by the waveguide/media combined structure. The electric field wraps around the sides and bottom of the ridge 12 in the waveguide 10 and spreads out into "wings" underneath the waveguide. The horizontal distance between FWHM contour lines 31 at hot spot 32 is about 70 nm at its narrowest part even though the ridge width is only 24 nm. The vertical distance between FWHM contour lines 33 at hot spot 32 is >>100 nm long even though the ridge 12 height is 36 nm. This elongation of the hot spot 32 is a result of the confinement of the field between the bottom of the ridge of the waveguide 10 and the media surface. According to this FDTD analysis, this waveguide structure is not useful for generating a small optical hot spot for heat assisted recording.

SUMMARY OF THE INVENTION

The invention comprises forming a recess in the ridge of a ridge waveguide at its terminal portion to space the ridge from the walls of the waveguide's aperture. The recessed ridge forms a tip at the end of the waveguide facing the media. The recessed ridge waveguide concentrates the electric field of light propagating in the ridge waveguide at the tip. The recess prevents the electric field from spreading away from the tip. This electric field may heat an adjacent work piece such as a magnetic recording medium for purposes of heat assisted magnetic recording. The dimensions of the hot spot created on the recording medium correspond to the size of the tip, which is significantly smaller than the wavelength of the light that propagates in the waveguide.

In one embodiment, the recess narrows as it spaces away from the aperture. In a second embodiment, the recess comprises a rectangular slot.

In a further feature of the present invention, the waveguide itself is recessed away from the recording medium surrounding the aperture.

The waveguide may form part of the magnetic structure of a thin film recording head by coating the poles of the head in an optically conducting metal, such as aluminum, gold, copper or silver.

The invention may also be used for recording information in the various optical data storage technologies including write once media like CD-R and DVD-R, phase change media like CD-RW and DVD_RW, and magneto-optic media.

DETAILED DESCRIPTION OF THE PREFERRED EMBODIMENTS

Figure 1:
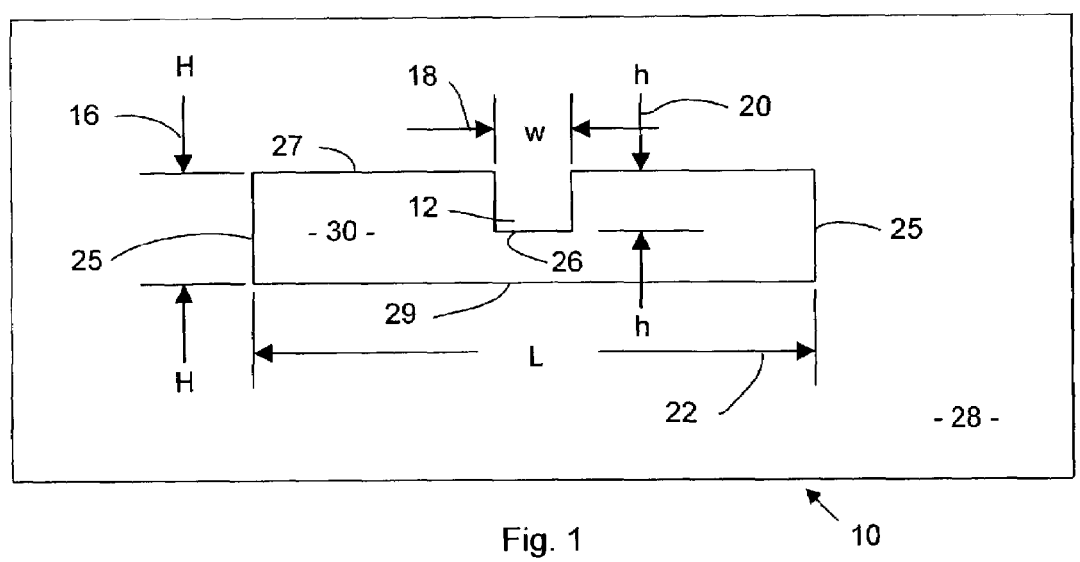
FIG. 1 is a plan view of a conventional ridge waveguide having a "C"-shaped aperture.
Figure 2:
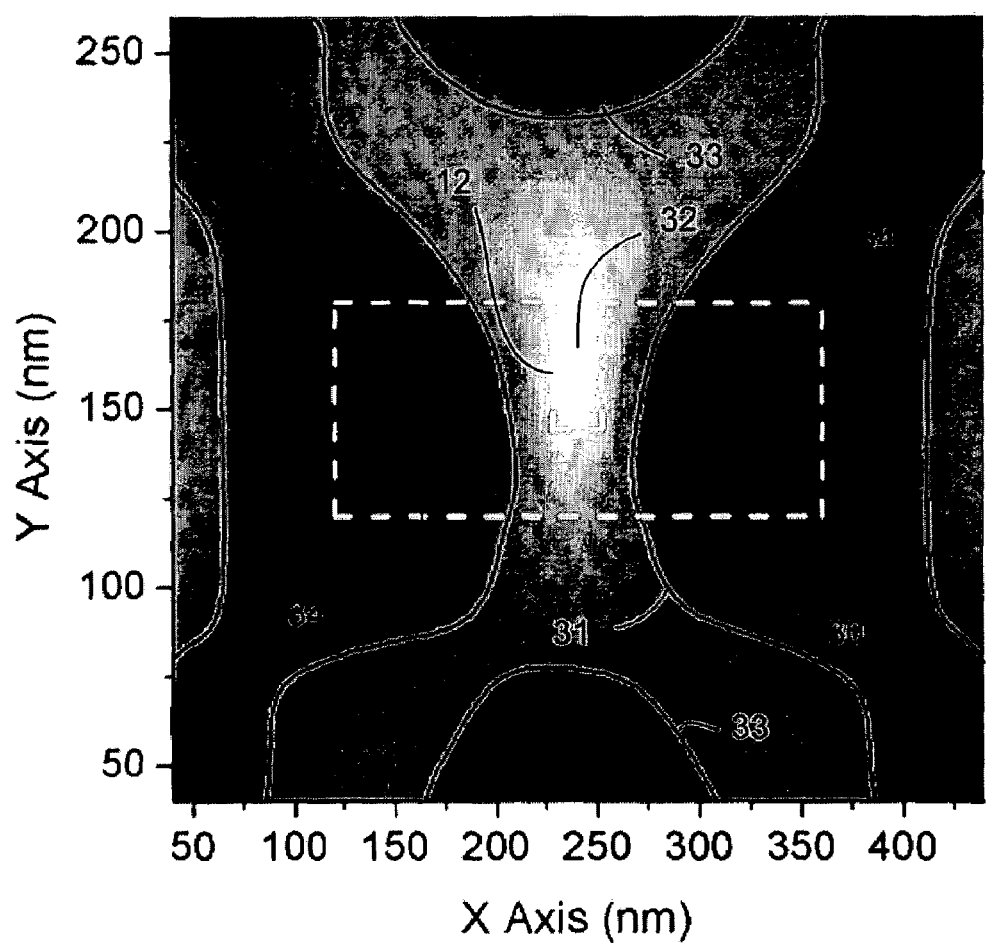
FIG. 2 is a contour chart illustrating the optical power density dissipated in a recording medium that is below the prior art ridge waveguide.
Figure 3:
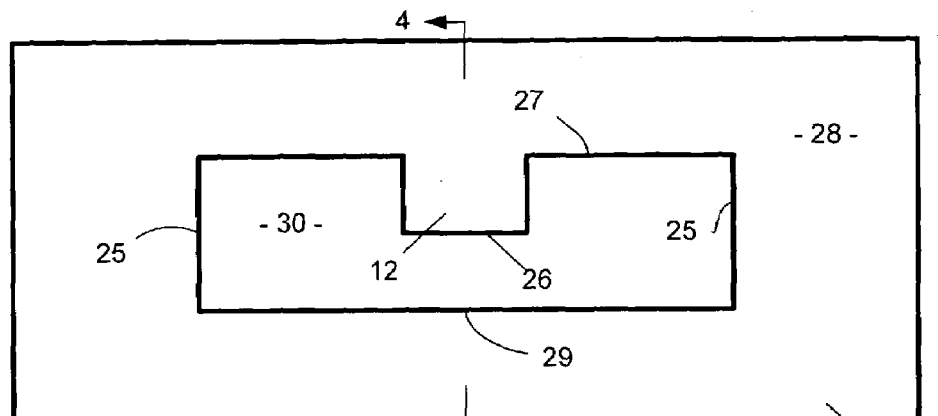
FIG. 3 is a top plan view of a ridge waveguide according to the present invention.

FIG. 3 illustrates a top plan view of the inventive waveguide structure 40. The waveguide 40 includes a "C"-shaped aperture 30 formed within a waveguide body structure 28. The body 28 of the waveguide 40 is composed of a highly conductive material such as gold, silver, copper or aluminum. Aperture 30 is formed by a pair of elongated walls 27 and 29, a pair of side walls 25 and a central ridge 12 extending into aperture 30 from one 27 of the elongated walls. The ridge 12 has a terminal wall 26 facing the opposite 29 elongated walls.

Figure 4:
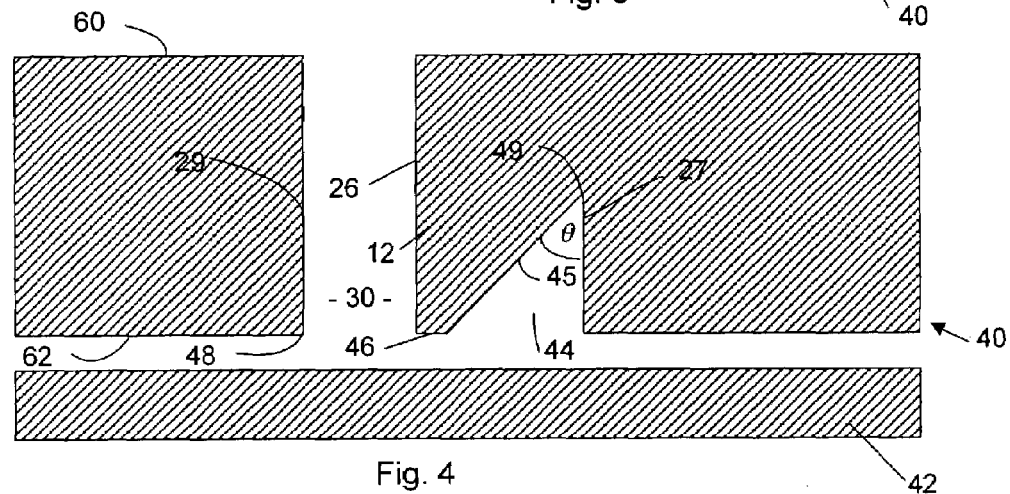
FIG. 4 is a cross-sectional view, taken along 4-4 of FIG. 3, of the inventive ridge waveguide adjacent a recording medium showing a tapered recess in the ridge.

FIG. 4 is a cross-section taken along 4-4 of FIG. 3. It illustrates a side cross-sectional view of the ridge waveguide 40 closely spaced from a recording medium 42. A beam of light may be focused on the top surface 60 of the waveguide 40. Light from the beam travels through the aperture 30 and exits the aperture 30 at a terminal end 48 of the aperture 30 at the bottom surface 62 of the waveguide 40. The light energy then spreads between the bottom surface 62 of the waveguide 40 and the adjacent recording medium 42.

The waveguide has a terminal portion extending between the terminal end 48 of the aperture 30 at or near the waveguide's bottom surface 62 to a height approximately adjacent the top 49 of a recess 44 formed in ridge 12. Recess 44 is formed in the ridge 12 in this waveguide terminal portion. The recess 44 extends in the ridge 12 between terminal end 48 of the aperture 30 at or near the waveguide's bottom surface 62 to the top 49 of the recess 44. The recess 44 spatially and electrically isolates the ridge 12 from the walls 25, 27 and 29 of the waveguide 40 adjacent the recording medium 42. The recess 44 includes an inclined wall 45 that diverges from an apex at its top 49 to the terminal end 48 of the aperture 30, forming the ridge 12 into a tip 46 at the terminal end 48 of the aperture 30 facing the recording medium 42.

Figure 5:
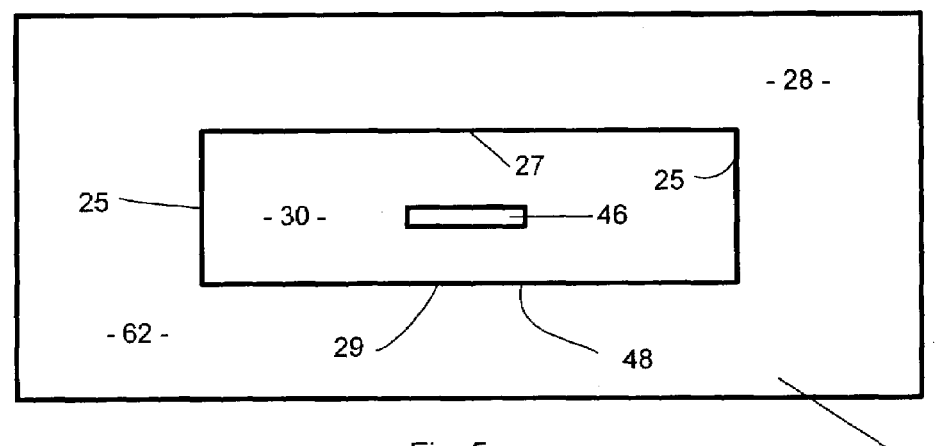
FIG. 5 is a bottom plan view of the recessed ridge waveguide.

FIG. 5 is a bottom plan view of the inventive waveguide structure 40, i.e. the view of the waveguide structure taken from the recording medium 42. The figure shows waveguide's bottom surface 62 and the ridge tip 46 spaced from waveguide walls 27, 29 and 25.

The dimensions of the "C"-shaped aperture 30 are chosen so that it has a transmission mode for incident light beams polarized perpendicular to the longer walls 27, 29 of the "C"-shaped aperture 30. These dimensions may be approximately calculated by well-known methods for determining propagating modes in ridge waveguides. Further refinement and optimization of the dimensions must be experimentally determined for the specific wavelength and metallic materials used in the waveguide.

The waveguide 40 has a propagating mode for an incident light beam of wavelength 900 nm when the dimensions of the "C"-shaped aperture are as follows: Elongated walls 27, 29 are 240 nm in length between sidewalls 25. Sidewalls 25 are 60 nm in height between elongated walls 27 and 29. The height of ridge 12 between wall 27 and its end 26 is 36 nm. The width of the ridge 12 in the direct parallel to the elongated walls 27 and 29 is 24 nm.

With a waveguide structure of these dimensions, the recess 44 is dimensioned such that the distance between tip 46 and wall 29 is 24 nm. The distance between tip 46 and wall 27 is 30 nm. The angle θ of the recess's inclined surface 45 is 37 degrees. The recess top 49 is located 50 nm above the terminal end 48 of the aperture 30. Referring to FIG. 5, the ridge tip 46 at the terminal end 48 of the aperture 30 is 6 nm in length in the direction parallel to wall 25. The ridge tip 46 is 24 nm in width in the direction parallel to elongated walls 27 and 29.

Figure 6:
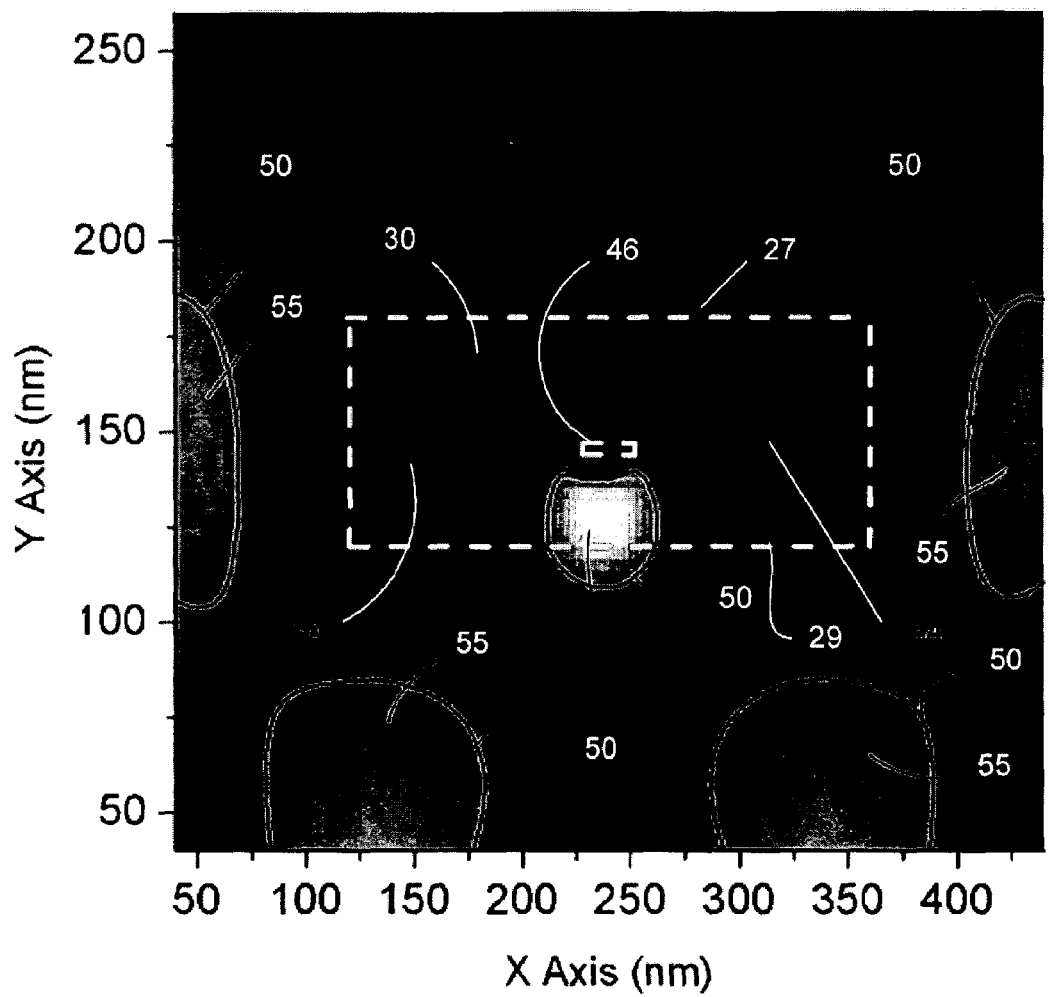
FIG. 6 is a chart illustrating the density of optical power dissipated within a recording medium placed below the inventive ridge waveguide.

An FDTD calculation of the power dissipated within a recording medium 42 spaced 10 nm below the waveguide 40 with these dimensions and light wavelength is shown in FIG. 6. In the figure, the black lines 50 are contours at the half-power level, white spot 52 is a hot spot indicating maximum power dissipation, and the dark spots 54 are cold areas representing minimum power dissipation. Shown in outline is the waveguide aperture 30 having elongated walls 27, 29 and a centrally located ridge guide tip 46. The hot spot 52 is located between the tip 46 and the elongated wall 29 opposite from the wall 27 from which the ridge extends. The hot spot 52 is about 30 by 50 nm in area. Note, however, the four areas of intermediate power dissipation 55 spaced away from the aperture 30. These will be discussed later in connection with FIG. 9.

This embodiment, therefore, provides a great improvement in optical power confinement over an unmodified ridge waveguide.

Isolation of the tip 46 of the ridge 12 can be accomplished in a variety of ways. The structure shown in FIG. 4 comprises a tapered wall 45. Alternative embodiments will be discussed below.

Figure 7:
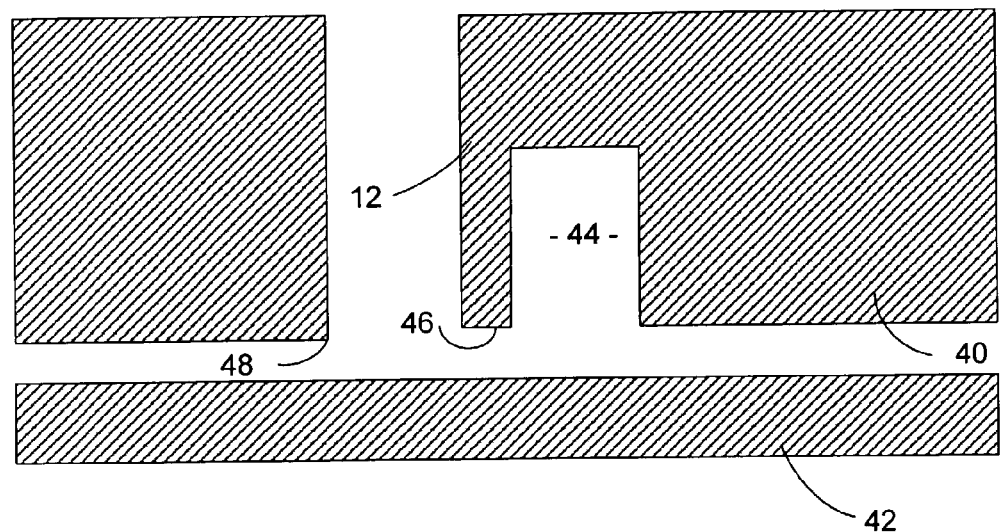
FIG. 7 is a cross-sectional view of another embodiment of the present invention showing a rectangular slot recess.

FIG. 7 illustrates another embodiment of the present invention. It varies from the previous embodiment in that ridge recess 44 comprises a rectangular cross-sectional slot. This structure is equivalent to the structure illustrated in FIG. 4, but may be easier to fabricate using conventional thin film processing techniques.

Figure 8:
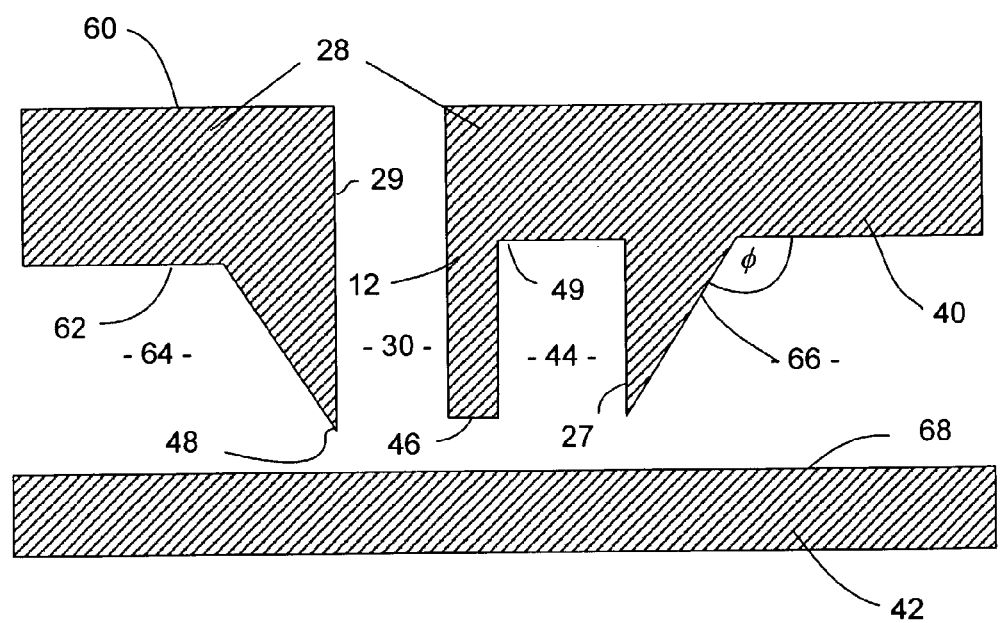
FIG. 8 is a cross-sectional view of a further embodiment of the present invention showing a recess in the waveguide surrounding the waveguide's aperture.

FIG. 8 shows an alternate embodiment of the present invention. Here the waveguide body 28 may be spaced away from the recording medium 42 in areas of the waveguide body not directly adjacent the waveguide's aperture 30. FDTD analysis indicates that the bottom surface 62 of the waveguide tends to trap the electric fields from the waveguide 40 against the top surface 66 of the medium 42. Spacing the waveguide body 28 away from the recording medium 42 reduces this effect.

In a preferred form, the waveguide body 28 can itself be tapered away from the aperture 30 as shown in FIG. 8 to form a body recess 64 in the waveguide body 28 completely surrounding the aperture 30. The body recess 64 may be formed by milling away material from the waveguide body 28 to form tapered surface 66 that completely surrounds aperture 30. Alternatively, the surface 66 may also be squared off as is the rectangular slot recess 44 shown in FIG. 7. When the body material 28 is so recessed, the bottom surface 62 is spaced further away from the recording medium 42 than is the terminal end 48 of the aperture 30.

Figure 9:
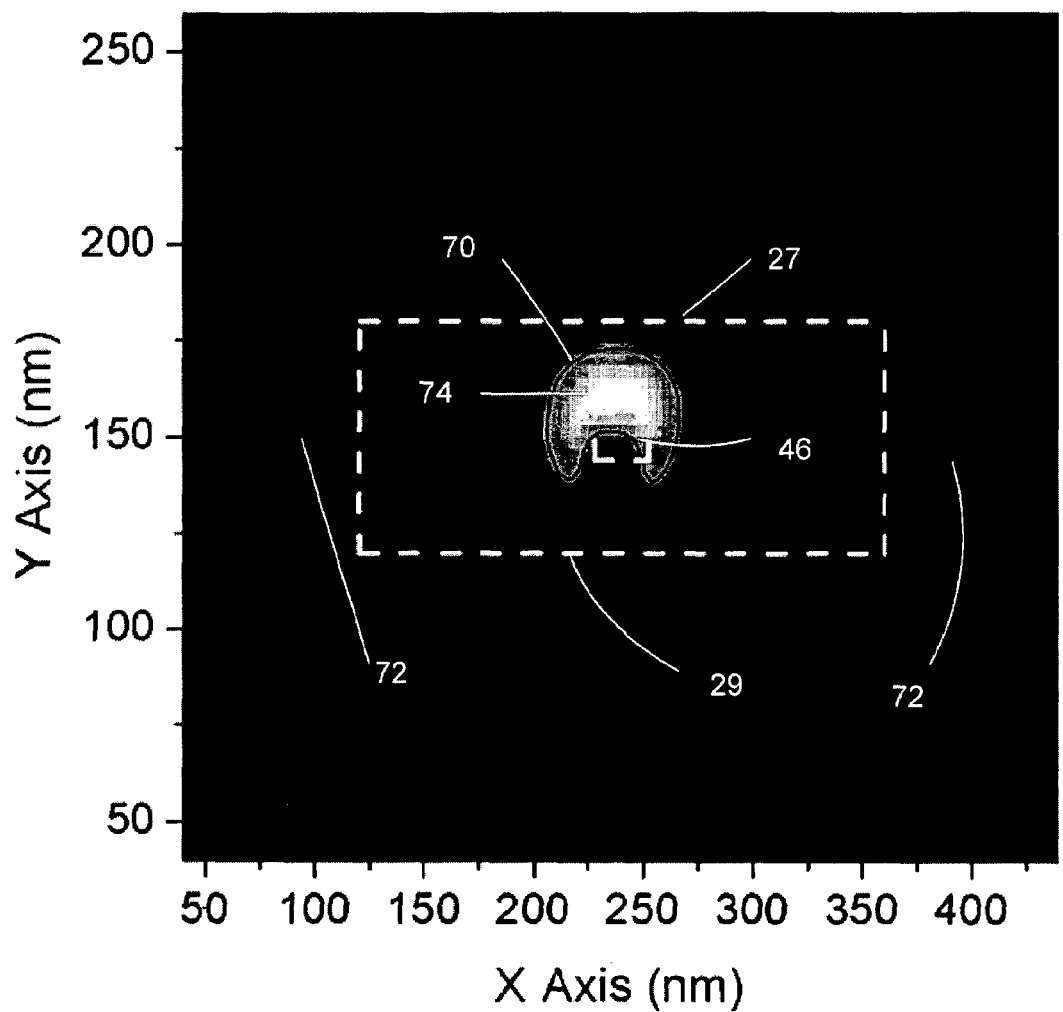
FIG. 9 is a chart illustrating the density of the optical power dissipated in a recording medium below the ridge waveguide illustrated in FIG. 8.

FIG. 9 is a FDTD calculation of the power dissipated in a recording medium 42 below the waveguide 40 for a waveguide having the structure illustrated in FIG. 8, and having the following dimensions. The "C"-shaped aperture wall and tip width dimensions are the same as given for FIG. 3 above. The rectangular recess 44 has a height of 50 nm from the bottom of tip 46 to the top 49 of the recess 44. The rectangular recess forms a tip 46 that is spaced 30 nm from wall 27 and 24 nm from wall 29. The distance across the tip 46 in the figure is 6 nm. The tapered surfaces 66 form an angle θ of 127 degrees with respect to the bottom surface 62 of the waveguide 40. The bottom surface 62 is spaced 50 nm from the terminal end 48 of aperture 30. The wavelength of the incident light on top surface 60 is 900 nm.

In FIG. 9, the FWHM contour of the dissipated power in the recording medium is shown as black line 70. Dark areas 72 are cold spots with a relative minimum of dissipated power. The centrally located white spot 74 is a hot spot where the maximum power is dissipated. Aperture 30 and ridge tip 46 are shown in outline. The power calculation for this geometry again gives a reasonably small hot spot on the order of 25 by 60 nm. Note also that the spaced hot spots 55 of FIG. 6 are missing. This is primarily due to the presence of the body recesses 64.

A waveguide 40 according to the present invention can be directly coupled to a remote light source. Alternatively, waveguide 40 may be a patterned thin film of conductive material formed or adhered to a transparent substrate (not shown). Light would then be focused on the top of the waveguide structure 40.

The better heat confinement of the recessed ridge waveguide structure is an advantage over either a ridge waveguide structure or a coaxial waveguide structure alone.

Figure 10:
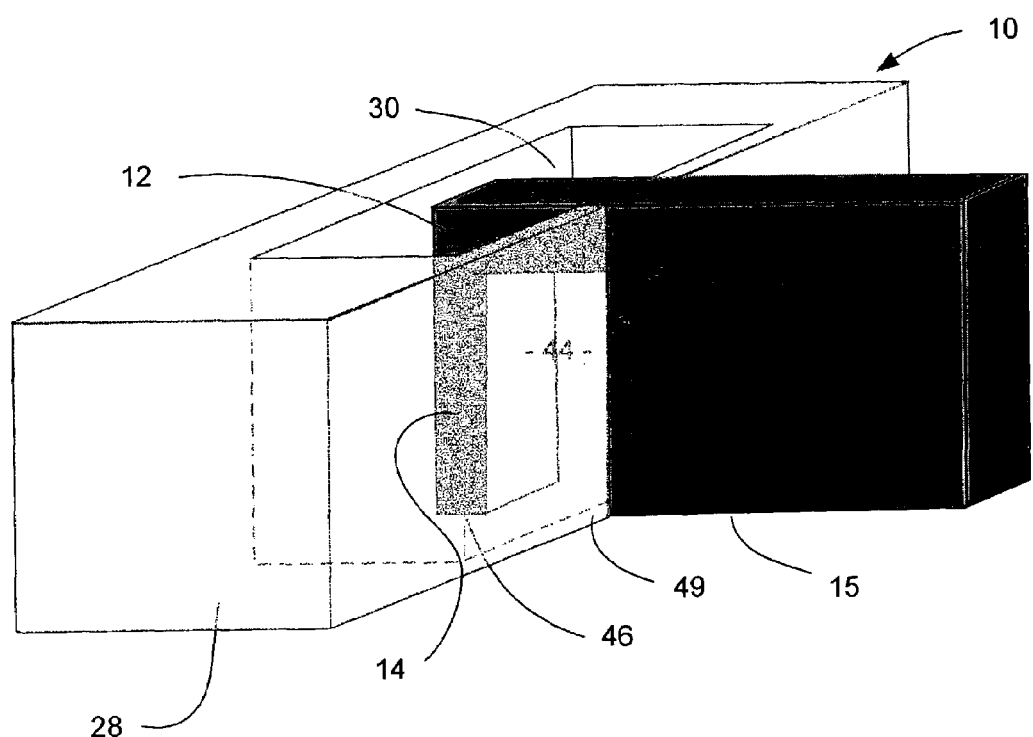
FIG. 10 is a perspective view of a ridge waveguide where the recording pole of a magnetic head is employed as the waveguide's ridge/pole tip.

Referring to FIG. 10, one method of integrating the waveguide into a conventional thin film head would be to use the recording pole 14 of the head as the ridge/tip (ridge 12, tip 46) in the waveguide 10. In the figure, a perpendicular recording pole 14 is connected to a flux return pole 15 above recess 44. This interconnection pole material, together with pole 14, projects into aperture 30 formed in the waveguide's (aluminum) conducting body 28 and forms ridge 12 of the waveguide 10. Tip 46, which is also functions as the magnetic recording pole tip, is formed by providing a recess 44 in the ridge portion 12 of the recording pole 14. The waveguide body 28 extends into the recess 44 to provide an optical shield between the pole 14 and the optically lossy material of the flux return pole 15.

Figure 11:
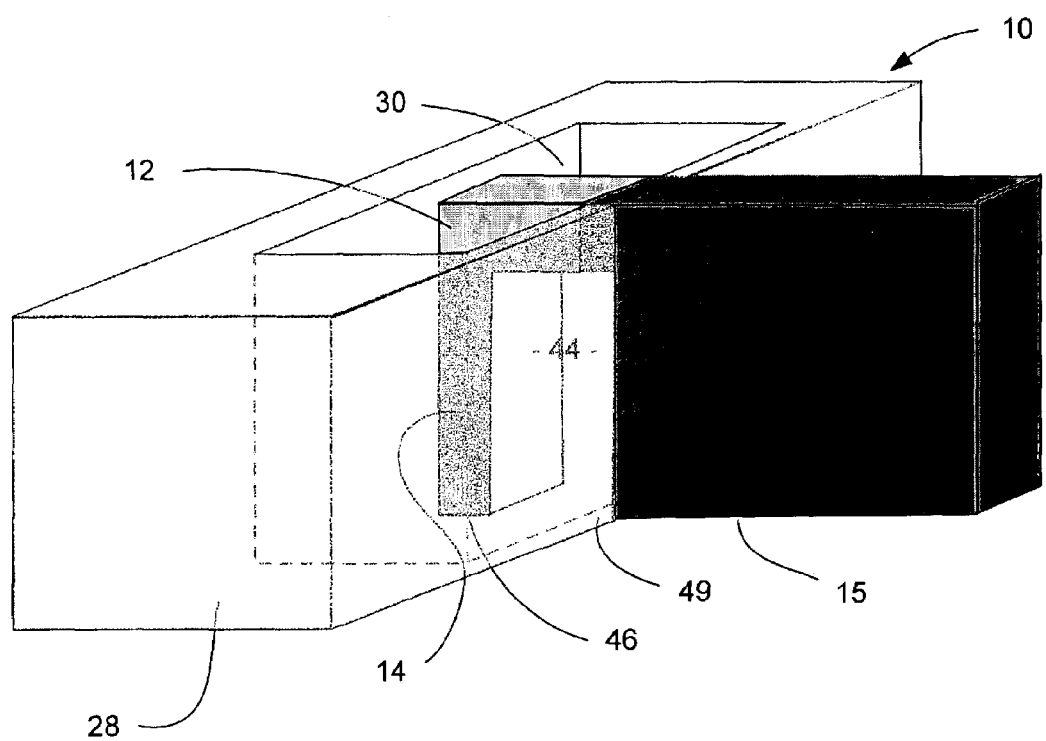
FIG. 11 is a perspective view of a variation of the combination recording pole/waveguide wherein the recording pole is encapsulated in the same material as that of the waveguide.

Referring now to FIG. 11, the recording pole 14 is typically composed of a high permeability magnetic alloy which in general has a much lower optical conductivity than gold, silver or aluminum. If the ridge/tip 12, 46 of the waveguide 10 were to be made in whole or part of this magnetic alloy rather than of gold, silver, aluminum, or some other highly conducting metal, the optical energy would not propagate as freely down the waveguide but would be highly absorbed. To mitigate this problem, the magnetic alloy of the recording pole 14 and ridge 12 can be encapsulated with a thin layer of a highly conducting metal film. Aluminum has the smallest skin depth of highly conducting metals at optical frequencies and is the preferred material used to coat the recording pole with a 10-15 nm layer. Silver and gold are other options.

While the above discussion of the preferred embodiments relates to optical, DVD and magnetic drive recording applications, the present invention is also useful in any application that requires the heating of a closely spaced work piece or any apparatus that requires the efficient transmission of light with a footprint far smaller than the incident wavelength. Such applications include near field microscopy and nanoscale photolithography. In the latter application, the confined beam produced by the present invention may be used to pattern substrates by photolithography with line width exposures that are significantly smaller than the wavelength of light.

The above description of the preferred embodiments is not by way of limitations on the scope of the appended claims. In particular, those of ordinary skill in the art may substitute other materials for the disclosed materials and other ridge waveguide structures than those described here. For example, ridge waveguide structures may include structures other than rectangular structures and may include, for example, half bow-tie structures.

I claim:

1. An apparatus, comprising:
   a waveguide for generating an optical spot on a data storage medium, said waveguide having a body defining an aperture and a ridge positioned in the aperture; and
   a recess positioned between a tip of said ridge and said body at a bottom surface of said waveguide.

2. The apparatus of claim 1, wherein said recess is structured and arranged to electrically isolate said tip of said ridge from said body.

3. The apparatus of claim 1, wherein said waveguide includes a terminal portion extending from said bottom surface to a top of said recess.

4. The apparatus of claim 3, wherein said terminal portion of said waveguide includes a terminal ridge portion adjacent said recess.

5. The apparatus of claim 4, wherein said terminal portion of said waveguide includes a terminal body portion adjacent said recess.

6. The apparatus of claim 5, wherein said recess spaces said terminal ridge portion from said terminal body portion.

7. The apparatus of claim 3, wherein said recess includes an inclined surface extending from said tip to said top of said recess.

8. The apparatus of claim 1, wherein said body of said waveguide includes a body recess formed therein.

9. An apparatus, comprising:
   a waveguide for generating an optical spot on a data storage medium, said waveguide defining an aperture, said waveguide having a bottom surface;
   a ridge positioned in the aperture and including a ridge tip adjacent said bottom surface; and
   a recess positioned between said ridge tip and said waveguide.

10. The apparatus of claim 9, wherein said ridge comprises a conductor.

11. The apparatus of claim 9, wherein said ridge comprises a magnetic recording pole.

12. The apparatus of claim 11, wherein said waveguide and said ridge comprising said magnetic recording pole are structured and arranged for heat assisted magnetic recording.

13. The apparatus of claim 9, wherein said recess is structured and arranged to electrically isolate said tip of said ridge from said waveguide.

14. The apparatus of claim 9, wherein said waveguide includes a terminal body portion extending from said bottom surface to a top of said recess.

15. The apparatus of claim 14, wherein said ridge includes a terminal ridge portion adjacent said recess.

16. The apparatus of claim 15, wherein said recess spaces said terminal ridge portion from said terminal body portion.

17. The apparatus of claim 9, wherein said waveguide includes a body recess formed therein.

18. An apparatus, comprising:
   a ridge waveguide for generating an optical spot on a data storage medium, said ridge waveguide having a bottom surface, said ridge waveguide including a body and a ridge having a ridge tip; and
   a recess positioned between said ridge tip and said body at said bottom surface.

19. The apparatus of claim 18, wherein said ridge comprises a magnetic recording pole.

20. An apparatus, comprising:
   a waveguide for generation an optical spot on a data storage medium, said waveguide defining an aperture, said waveguide having a bottom surface;
   a recording pole positioned in the aperture and including a recording tip adjacent said bottom surface; and
   a recess positioned between said recording tip and said waveguide.

21. The apparatus of claim 20, wherein said waveguide and said recording pole are structured and arranged for heat assisted magnetic recording.

22. A data storage device, comprising:
   a data storage medium;
   a waveguide adjacent said data storage medium for generating an optical spot on said data storage medium, said waveguide having a body defining an aperture and a ridge positioned in the aperture; and
   a recess positioned between a tip of said ridge and said body at a bottom surface of said waveguide.

* * * * *

UNITED STATES PATENT AND TRADEMARK OFFICE
CERTIFICATE OF CORRECTION

PATENT NO. : 7,272,102 B2 Page 1 of 1
APPLICATION NO. : 10/402880
DATED : September 18, 2007
INVENTOR(S) : William Albert Challener It is certified that error appears in the above-identified patent and that said Letters Patent is hereby corrected as shown below:

Cover Page 2
Shi et al., "Nano-Aperture with Ultra-High Power Throughput for VSAL," Paper [WCT,] WC7, Proceedings of the Optical Date Storage Meeting, Sante Fe, NM (2001).

Column 8, Line 22 (Claim 20)
"waveguide for generation" should read -- waveguide for generating --

Signed and Sealed this

Fourth Day of March, 2008

JON W. DUDAS
*Director of the United States Patent and Trademark Office*